United States Patent [19]

Katsumata

[11] Patent Number: 5,018,178
[45] Date of Patent: May 21, 1991

[54] MEDICAL APPARATUS WITH A CONTROL CONSOLE

[75] Inventor: Kenichirou Katsumata, Ootawara, Japan

[73] Assignee: Kabushiki Kaisha Toshiba, Kawasaki, Japan

[21] Appl. No.: 595,696

[22] Filed: Oct. 5, 1990

Related U.S. Application Data

[63] Continuation of Ser. No. 320,252, Mar. 7, 1989, abandoned.

[30] Foreign Application Priority Data

Mar. 8, 1988 [JP] Japan .................... 63-54065

[51] Int. Cl.⁵ .................... A61B 6/00; H05G 1/08; H05G 1/10; G21K 1/12
[52] U.S. Cl. .................... 378/91; 378/4; 378/8; 378/95
[58] Field of Search .................... 378/4, 8, 91, 95, 99, 378/98, 114, 4, 9, 21; 364/413.14, 413.13, 413.26, 709.12, 710.12, 709.13, 709.11

[56] References Cited

U.S. PATENT DOCUMENTS

| | | | |
|---|---|---|---|
| 3,777,124 | 12/1973 | Pavkovich | 378/91 |
| 4,071,769 | 1/1978 | Brunnett et al. | 378/4 |
| 4,501,009 | 2/1985 | Abele | 378/4 |
| 4,597,094 | 6/1986 | Kleinman | 378/95 |
| 4,773,086 | 9/1988 | Fujita et al. | 378/4 |
| 4,775,993 | 10/1988 | Kaul et al. | 378/91 |

*Primary Examiner*—Edward P. Westin
*Assistant Examiner*—Don Wong
*Attorney, Agent, or Firm*—Finnegan, Henderson, Farabow, Garrett, and Dunner

[57] ABSTRACT

A main body comprising a gantry having an X-ray tube and a detector incorporated therein and a bed is disposed within a test room. A main console for general use and a simplified console are disposed within an operation room. The main console permits selection of all the sequences conducted by an X-ray CT apparatus and setting of all the parameters. The simplified console has some of the functions available by the main console, and it inhibits selection of a certain sequence and setting of certain parameters, automatically selects such a sequence, and automatically sets such parameters. The main console and simplified console are coupled to a CPU through a selector and console I/F. A disk memory device is also coupled to the CPU. The selector normally connects the main console to the console I/F and connects the simplified console to the console I/F when instructed by a command from the simplified console. The selector may be interlocked with a timer so that it connects the main console to the console I/F during day time and connects the simplified console to the console I/F at night.

15 Claims, 16 Drawing Sheets

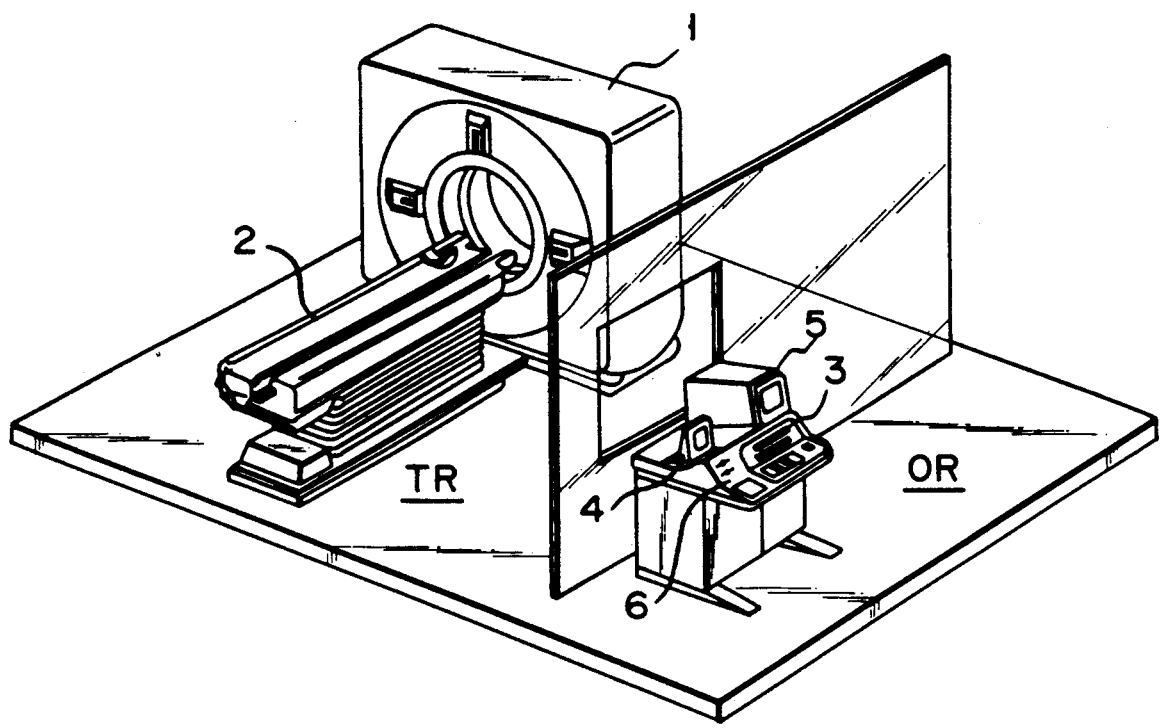
F I G. 1
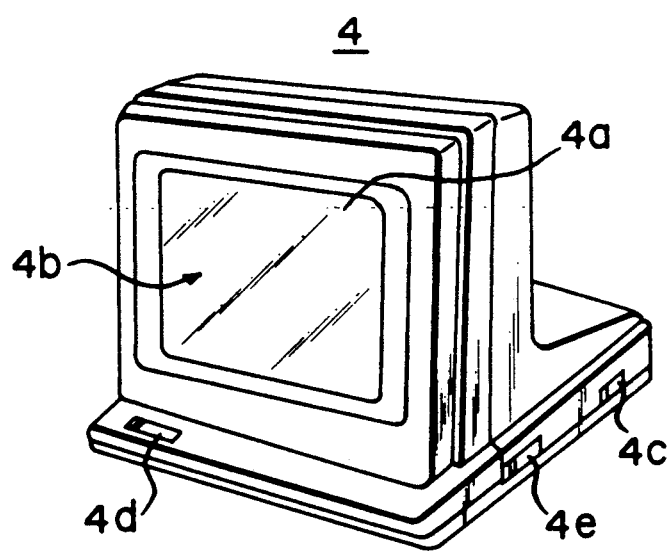
F I G. 2

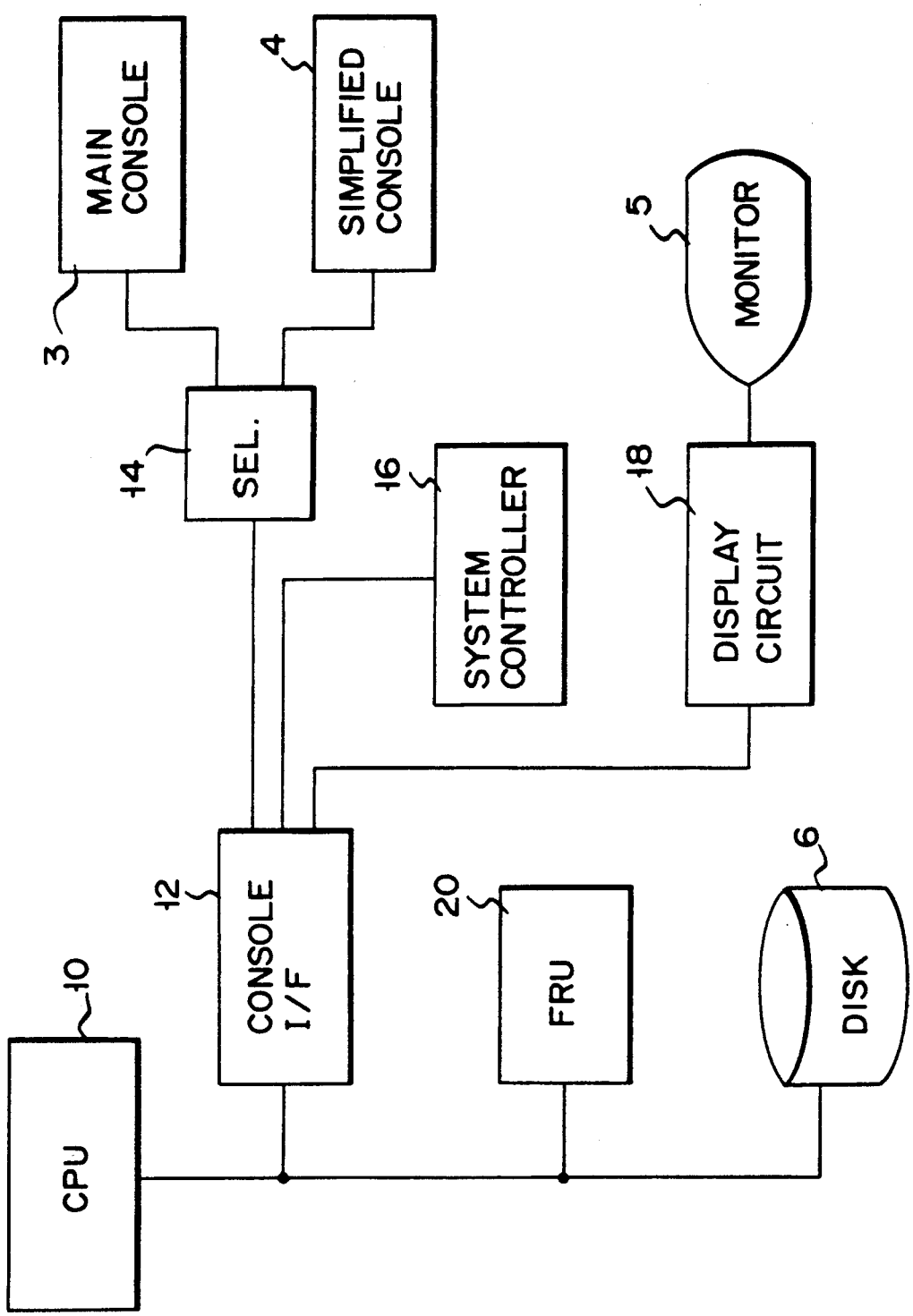
F I G. 3

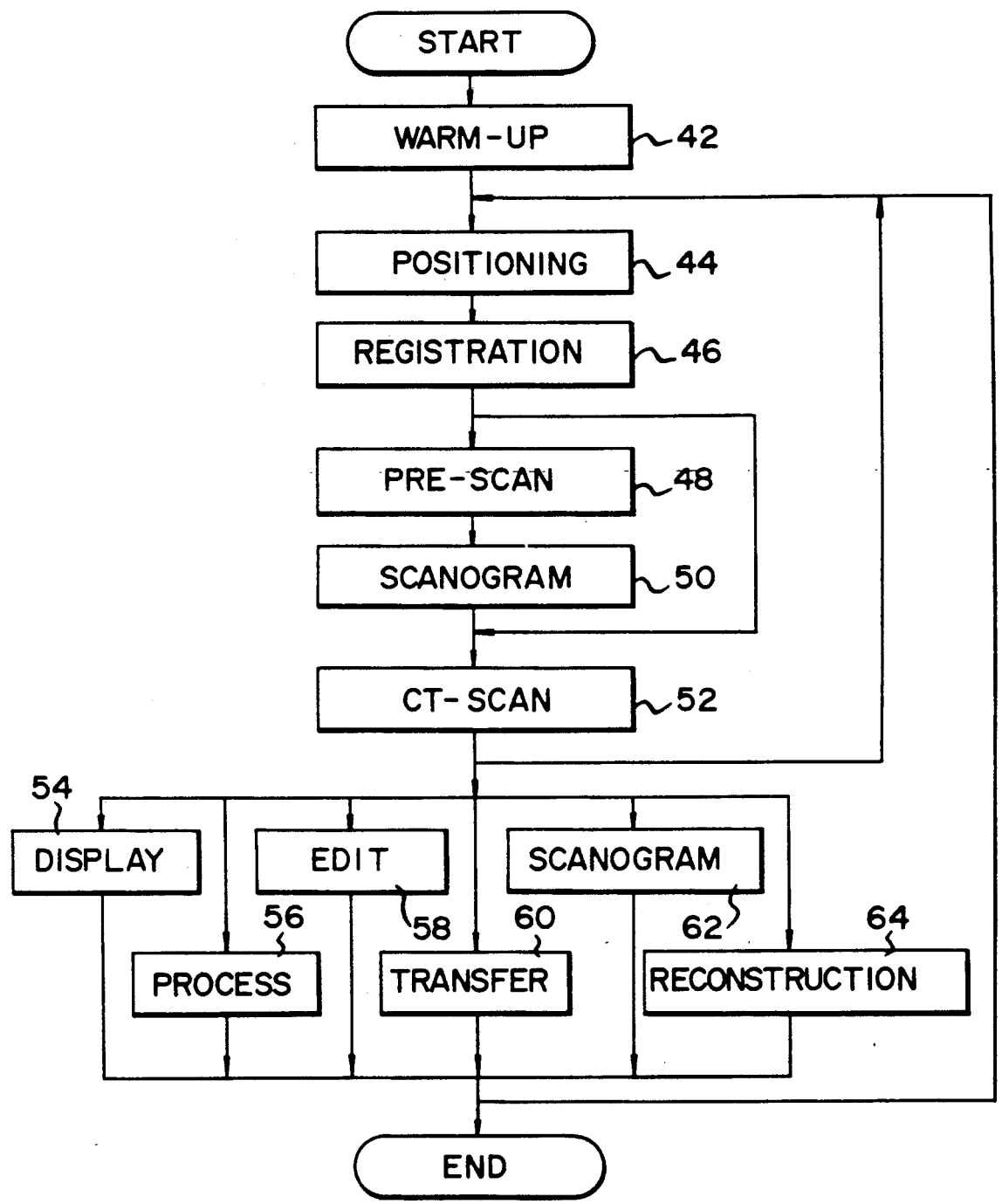
F I G. 4

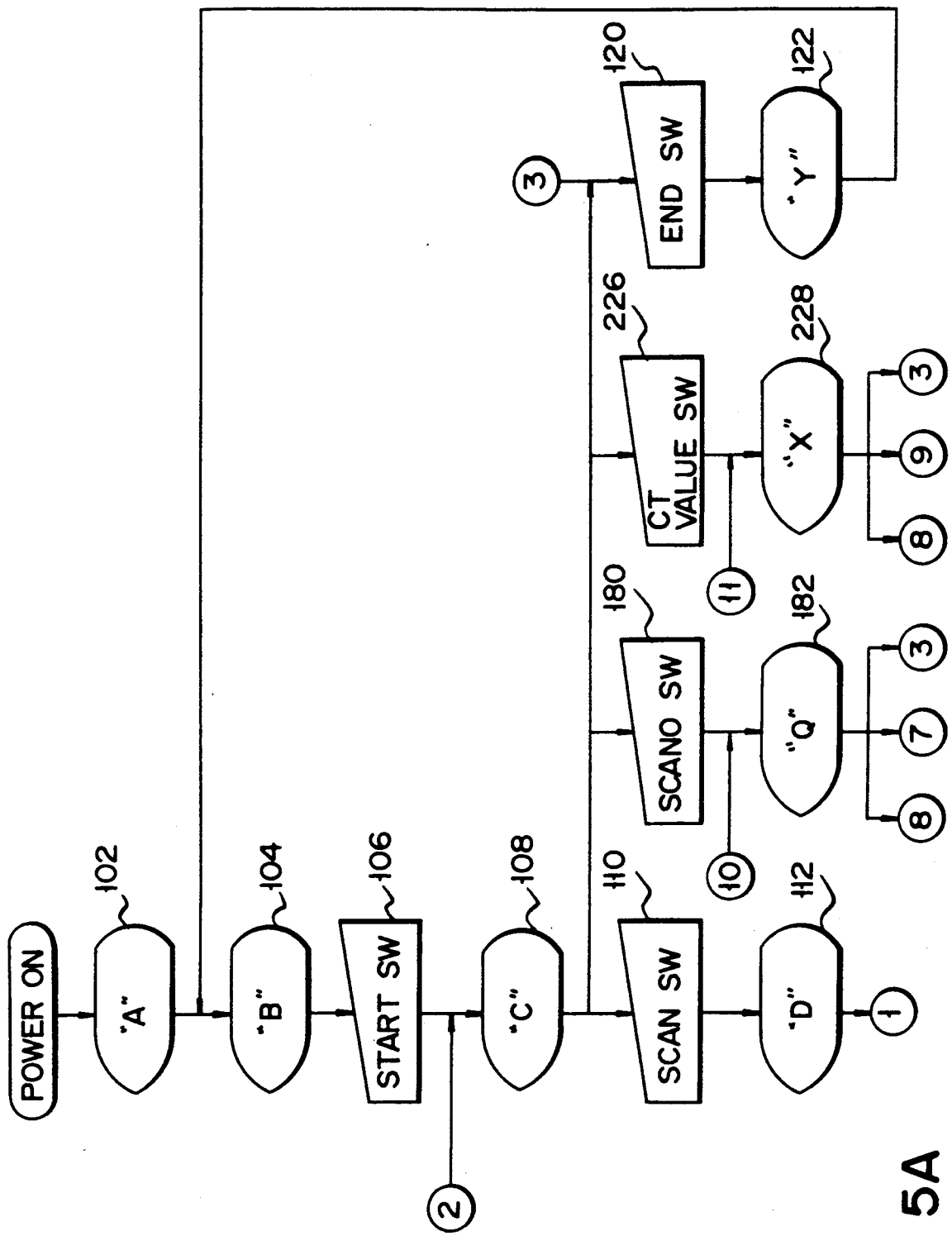
F I G. 5A

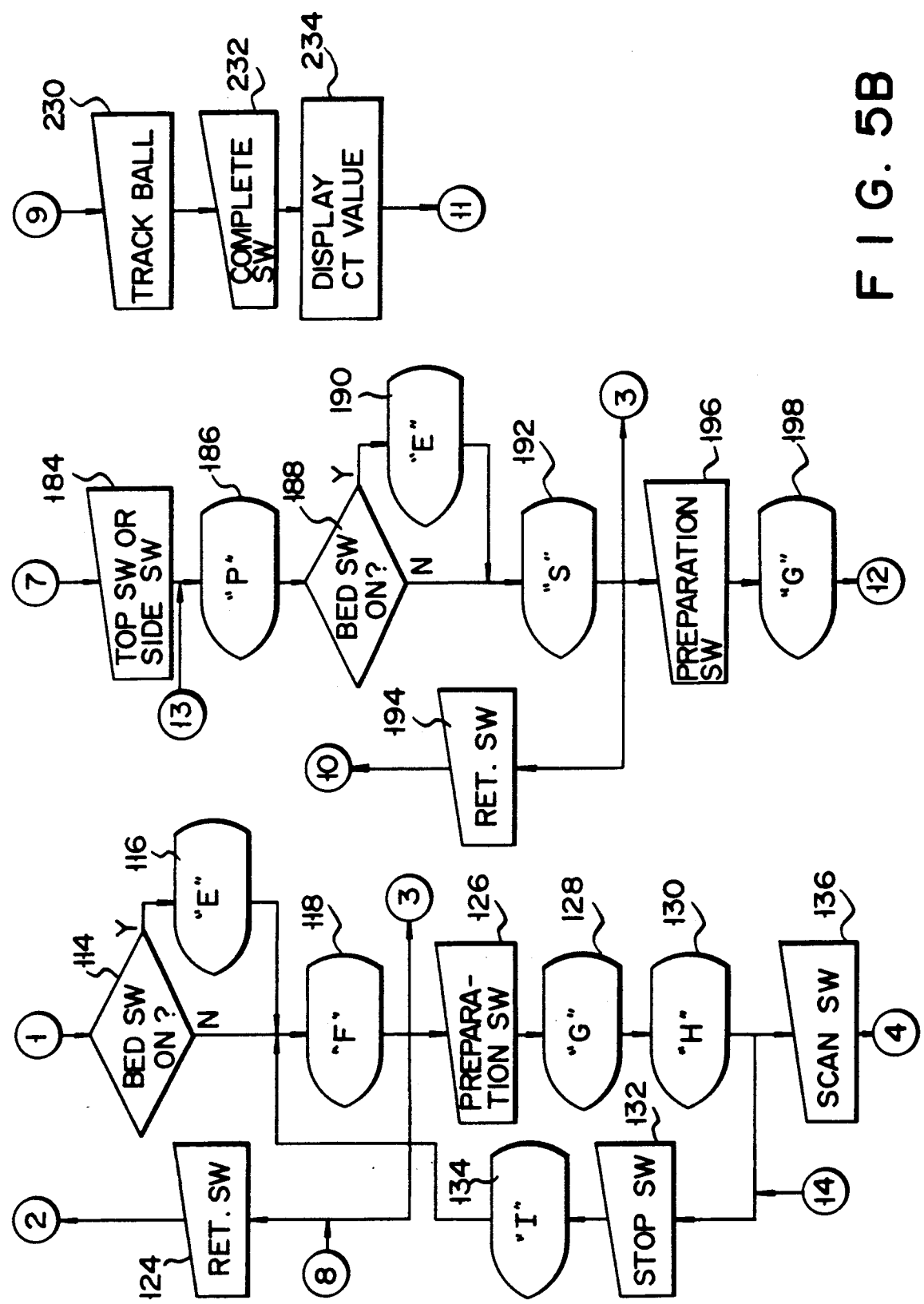

FIG. 6A

SELF-CHECKING

FIG. 6B

TOUCH
START SW

START

FIG. 6C

SELECT MODE

SCAN

HEAD ABDO

SCANO

HEAD ABDO

END

CT VALUE

FIG. 6D

SCAN CONDITION
BEING SET

SCAN HEAD

FIG. 6E

TURN-OFF BED-
LOCAL-SW

FIG. 6F

TOUCH
PREPARATION SW

| PREPA-
RATION |

| END |   | RET |

F I G. 6G

SCAN BEING
PREPARED

F I G. 6H

TOUCH
SCAN SW        | SCAN |

SCAN HEAD

TO STOP SCAN,  | SCAN |
TOUCH STOP SW  | STOP |

F I G. 6I

SCAN
STOPPED

FIG. 6L

RECONSTRUCTION
BEING DONE

SCANO ABDOMEN

FIG. 6N

RECONSTRUCTION
COMPLETED

SCANO ABDOMEN

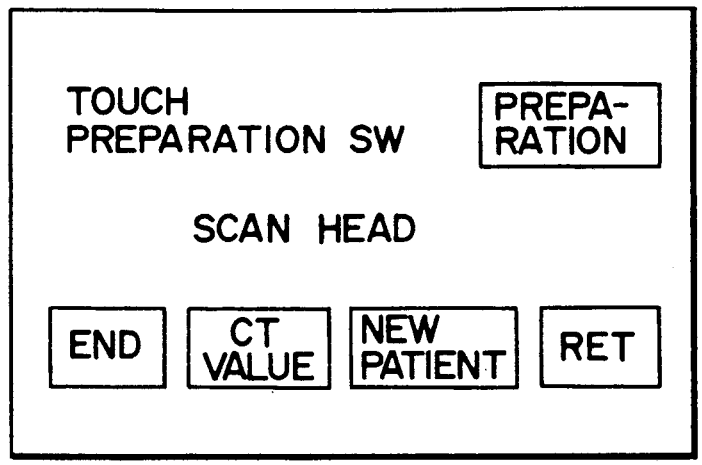
F I G. 6O
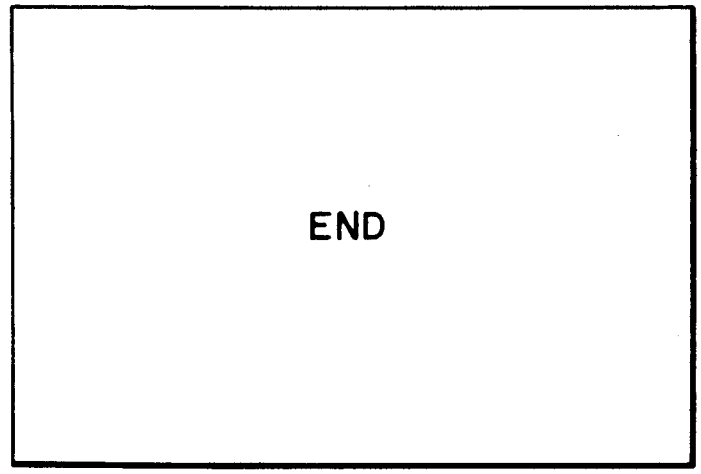
F I G. 6P
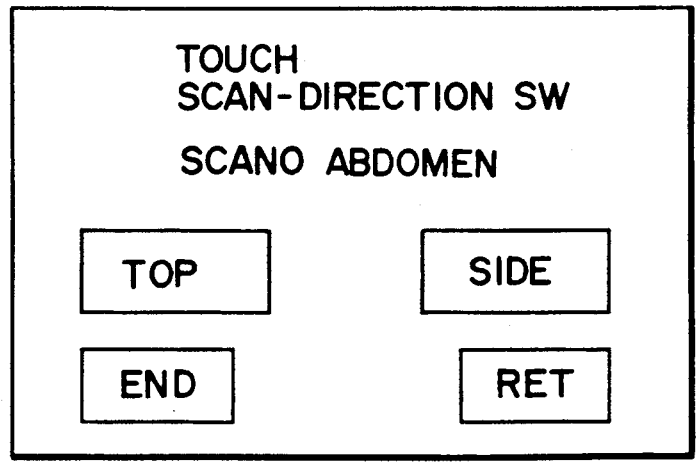
F I G. 6Q

FIG. 6R

SCANO BEING
PREPARED

SCANO ABDOMEN

FIG. 6S

TOUCH
PREPARATION SW          [PREPA-RATION]

SCANO ABDOMEN

[END]                              [RET]

FIG. 6T

TOUCH
SCAN SW                       [SCAN]

SCANO ABDOMEN

TO STOP SCAN,           [SCAN
TOUCH STOP SW           STOP]

FIG. 6U

SCAN BEING DONE

SCANO ABDOMEN

IF YOU STOP SCAN,
TOUCH STOP SW    | SCAN STOP |

FIG. 6V

MOVE LINE TO
SCAN START POSITION

THIS DONE,
COMPLETE SW    | COMPLETE |

| END |    | RET |

FIG. 6W

TOP-PLATE
BEING MOVED

WATCH
PATIENT

MEDICAL APPARATUS WITH A CONTROL CONSOLE

This application is a continuation of application Ser. No. 07/320,252 filed Mar. 7, 1989.

BACKGROUND OF THE INVENTION

1. Field of the Invention

The present invention relates to a medical apparatus such as an X-ray CT (computer tomography) apparatus or an MRI (magnetic resonance imaging) apparatus which, when used, needs a selection of an operational sequence or various parameters in each proceeding stage.

2. Description of the Related Art

A third generation X-ray CT apparatus is one of such medical apparatus. An X-ray tube and a detector are disposed within a gantry to face each other with a patient-bearing bed in between. Projection data of a patient on the basis of transmitted X rays in many directions can be acquired by rotating the X-ray tube and detector around the patient while maintaining the positional relation between the two units. A tomographic image is obtained by reconstructing the projection data.

The simplest diagnostic sequence is to place a patient on a bed first, depress a top plate slide switch on a console or the bed to slide the top plate of the bed to set the desired portion of the patient within an imaging region, set various scan parameters properly or to predetermined values, and depress a scan set button on the console to set the parameters. Then, a scan start button on the console is depressed to start scanning the patient. The scan parameters include the number of X rays (357, 600, 800), the diameter of the imaging region (160, 210, 240, 300, 350, 400 mm), the thickness of a slice (2, 5, 10 mm), an X-ray tube current (120, 250, 400 mA), a window level WL, a window width WW and the amount of slide increment of the top plate. The above operational sequence may include a step of selecting either a tomographic image or a scanogram, an image processing step and/or a step for selecting the display/output mode.

Accordingly, there are various switches and buttons provided on the console to select the proper sequence for a diagnosis as well as to set various parameters, which is likely to make an novice operator nervous about an erroneous operation of the switches and buttons or causing or facing an abnormal situation. If an emergency case is brought in at night and only a novice operator is available, therefore, it is likely that the proper diagnosis cannot be made or such a diagnosis takes an unusually long time.

SUMMARY OF THE INVENTION

Accordingly, it is an object of this invention to provide a medical apparatus which involves a complicated selection of sequences and many parameters to be set for making the proper diagnosis but which is easy to operate even for a novice operator.

The present medical apparatus comprises a main console having functions to select an operational sequence and set parameters in each step in the sequence, a simplified console which renders some of the functions of the main console unselective or unsettable but provides automatic selection and setting of such functions, and means for switching between the main console and simplified console.

BRIEF DESCRIPTION OF THE DRAWINGS

FIG. 1 is a schematic, general view of an X-ray CT apparatus according to one embodiment of this invention;

FIG. 2 is a perspective view illustrating a simplified console;

FIG. 3 is a circuit diagram of a control circuit;

FIG. 4 is a flowchart illustrating a typical operation of an X-ray CT apparatus;

FIGS. 5A through 5D are flowcharts illustrating operational sequences for a case where the simplified console is used.

DETAILED DESCRIPTION OF THE PREFERRED EMBODIMENT

Figure 5C:
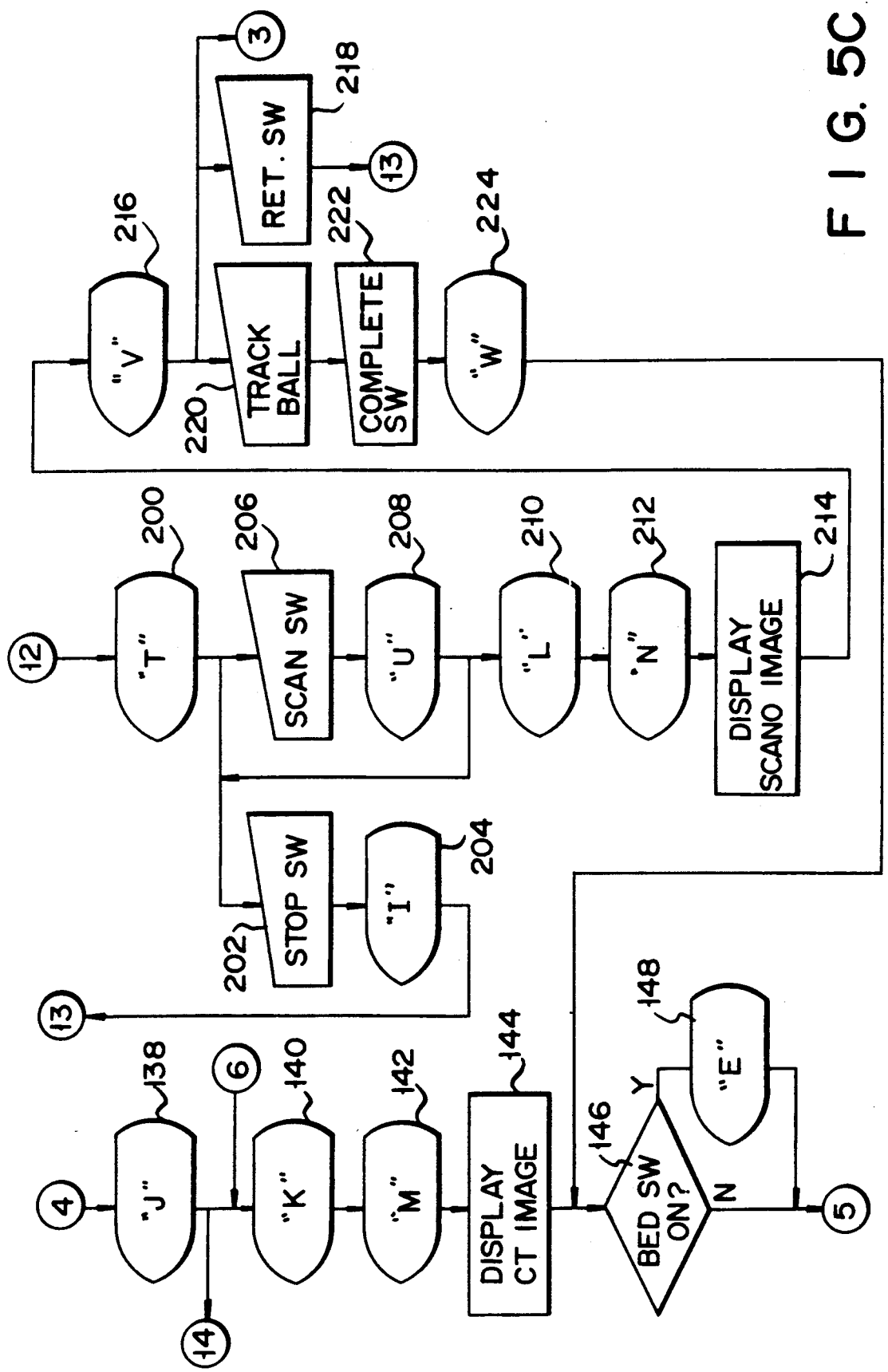
Figure 5D:
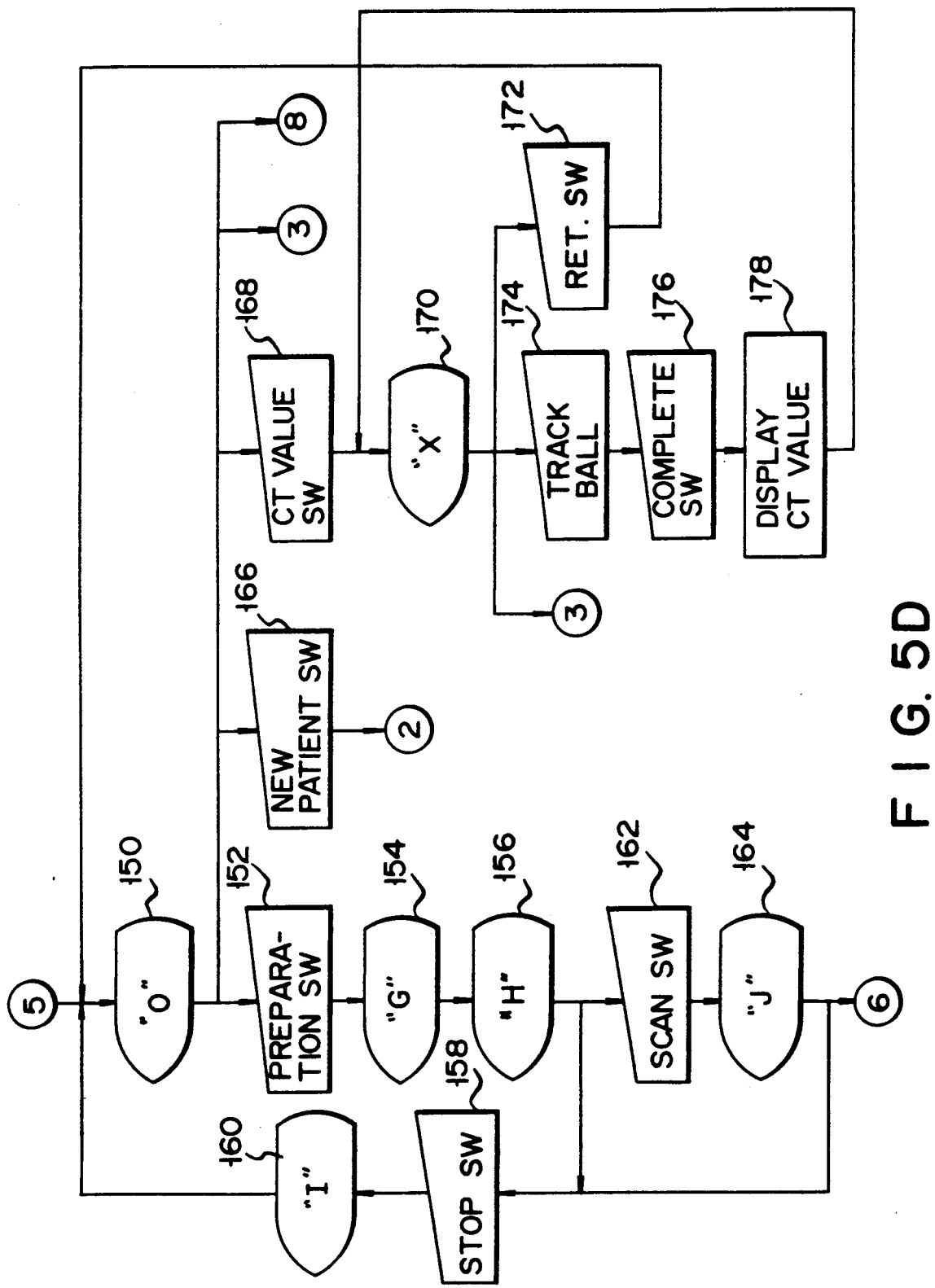

FIG. 1 is a schematic diagram illustrating the main structure of a third generation X-ray CT apparatus according to one embodiment of this invention. A test room TR and an operation room OR are separated by a wall having a glass window provided at part thereof. A main body comprising a gantry 1 having an X-ray tube and a detector incorporated therein and a bed 2 is disposed within the test room TR. Disposed within the operation room OR are a main console 3 for general use and a simplified console 4. The main console 3 permits selection of all the sequences conducted by the X-ray CT apparatus and setting of all the parameters. The simplified console 4 has some of the functions available by the main console 3, and it inhibits selection of a certain sequence and setting of certain parameters, instead automatically selects such a sequence and automatically sets such parameters. The main console 3 is a keyboard having key switches and buttons provided thereon, and the simplified console 4 is disposed on the top of the main console 3. Also provided on the top of the main console 3 are a monitor 5 for displaying a picked-up image or a guidance message for operation of the main console, and a disk memory device 6 for storing images, control programs and preset data for providing automatic setting of a sequence or parameters when the simplified console 4 is in use in place of manual setting through the console.

In contrast to the main console 3 which has key switches and buttons, the simplified console 4 is not provided with key switches as shown in FIG. 2. Instead, the simplified console 4 is provided with a touch panel 4b made of a transparent sheet switch provided in front of a display section 4a constituted by a plasma display, and touch switches are provided on the touch panel 4b. The display of the simplified console 4 is changed for each operational step, and it displays touch switches and a guidance on a display screen so as to permit an operator to effect a switch operation by touching the transparent sheet switch 4b with his finger. Although not illustrated, there is a machine room as separate from the test room and operation room and an X-ray generation control machine and a computer are disposed in the machine room. The simplified console 4 is also provided with a power switch 4c, a lamp 4d for indicating power ON and a brightness control knob 4e.

FIG. 3 is a circuit diagram of a control circuit used in this embodiment. An FRU (fast reconstruction unit) 20 and the memory device 6 are coupled to a CPU 10. The output of the CPU 10 is supplied through a console I/F 12 to a selector 14, a system controller 16 and a display circuit 18. The display circuit 18 is coupled with the monitor 5. The selector 14 normally connects the main console 3 to the console I/F 12 and connects the simplified console 4 to the console I/F 12 only in a specific case. In this embodiment, a command from the simplified console 4 permits the console 4 to be coupled to the console I/F 12 instead of the main console 3. It is, however, possible that the selector 14 is interlocked with a timer, and connects the main console 3 to the console I/F 12 during day time and the simplified console 4 to the console I/F 12 at night. Therefore, either the main console 3 or simplified console 4 is coupled to the system controller 16 and display circuit 18 so that various control commands can be given to them from either the console 3 or 4. When the simplified console 4 is selected, scan parameters are not input from the simplified console 4 but those read out from the memory device 6 would be set.

FIG. 4 illustrates the flow of the general operation of the present apparatus controlled by a control command from the main console 3. When power is given and the operation starts, an operator should wait for a predetermined time for warming up the apparatus in step 42. In step 44, the top plate of the bed is moved to align a patient. Patient data such as the name and code of the patient are registered in step 46. In the next step 48, pre-scanning is effected to acquire a scanogram. At this time, the gantry will not be rotated and X-ray projection data from one direction is acquired. A scanogram process (scan planning) is carried out to determine a target slice from the obtained radiation image in step 50. In step 52, a CT scanning is carried out to attain the sliced image. The next step will be one of an image display in step 54, image processing in step 56, image editing in step 58, image transfer in step 60, a scanogram process in step 62 and image reconstruction in step 64, which is selected by operation on the main console 3.

When the simplified console 4 is used to control the apparatus, the patient data registering in step 46, image display in step 54, image editing in step 58, image transfer in step 60, scanogram process in step 62 and image reconstruction in step 64 are set unavailable for simplicity of sequence selection. A simple image display and a simple image reconstruction can be, however, executed automatically. With regard to registration of patient data, only the name of the patient can be input but the other data can be automatically input by preset parameters which are read out from the memory device 6. Further, for simplicity in setting parameters in the case where the simplified console 4 is used, the number of available choices in each of the pre-scanning in step 48, scanogram process in step 50, CT scanning in step 52 and image processing in step 56 is reduced to thereby reduce the complicated selection.

More specifically, the simplified console 4 has the following, minimum selection and setting functions: selection between scanning for obtaining a sliced image and obtaining a scanogram, selection between scanning of a head and an abdomen, setting of an ROI for obtaining a CT value, etc. These choices are displayed in the form of touch switches together with a guidance on the screen which is changed with the flow of the operation.

The operation involving the simplified console 4 will now be described referring to the flowcharts shown in FIGS. 5A-5D. FIGS. 6A through 6Y illustrate displays of the simplified console 4 in the individual display steps in the flowcharts.

When power is given to the simplified console 4, self-checking is executed in step 102 and a display "A" such as the one shown in FIG. 6A is given.

When the self-checking is completed, a display "B" as shown in FIG. 6B is given in step 104 requesting an instruction to start the operation by the simplified console 4. Until this moment, the operation of the main console 3 is also effective.

When the start switch on the screen shown in FIG. 6B is touched in step 106, however, the selector 14 disconnects the main console 3 from the console I/F 12 to disable the operation of the console 3 and connects the simplified console 4 to the console I/F 12 instead. Thereafter, the operation of the simplified console 4 is enabled. And a patient number of "1" is automatically generated.

In step 108, a display "C" as shown in FIG. 6C is given requesting selection of either scan or scano (both only for a head and an abdomen).

When the end switch on the screen shown in FIG. 6C is touched as in step 120, a display "Y" is given in step 122 indicating the end (see FIG. 6Y) of the operation, and the flow returns to step 104 where the display shown in FIG. 6B is given. At this time, the operation of the main console 3 is effective unless the start switch on the screen of FIG. 6B is touched.

When a scan (head) switch on the screen of FIG. 6C is touched as in step 110, preset scan parameters stored in the memory device 6 are automatically set and a display "D" as shown in FIG. 6D is given in step 112 indicating that the scan parameters are being set.

To execute the operation up to this point by the main console 3, a patient registering button is depressed and predetermined data regarding eleven items displayed on the display screen is entered through the keyboard. "Adult-Head" among six PAS (program automatic selection) buttons is depressed. When omitting scano-scanning and immediately starting CT-scanning, "SET" (axial) is depressed and the number of slices is set to "1" by a digital switch to start scanning of the next slice after confirming the slice image. A contrast medium button is turned on or off in accordance with a case where a contrast medium is injected or not. The eleven items comprises a patient number, a patient name, first to fourth comments, number of slices, a portion of the patient to be scanned, an insert direction of the patient, a direction of image display, and a keyword of the optical disk. This complicated operation required when the main console is used is automated in a case where the simplified console is in use, thus permitting even a novice operator to conduct a medical diagnosis easily. When the simplified console is used, the patient number is automatically set, the first to fourth comments are omitted, the number of slices is set to "1", and the other items are preset for customers.

It is discriminated in step 114 whether or not a local switch on the bed is turned ON. If this switch is ON, an alarm message "E" is given in step 116 requesting that the bed-local-switch be turned OFF as shown in FIG. 6E.

With the main console 3 in use, when the bed-local-switch is ON, the operator is informed of occurrence of an abnormality by inhibiting a preparation switch from flickering.

A display "F" is given in step 118 requesting an instruction to be ready for an imaging process as shown in FIG. 6F.

With the main console in use, the preparation switch flickers requesting that this switch be operated.

When the end switch on the screen as shown in FIG. 6F is touched as in step 120, the flow returns to step 104 (displaying what is shown in FIG. 6B) through step 122 (displaying what is shown in FIG. 6Y). When a return switch on the screen of FIG. 6F is touched as in step 124, the flow returns to step 108 (displaying what is shown in FIG. 6C).

When the preparation switch on the screen of FIG. 6F is touched in step 126, scan preparation is automatically executed and a display "G" is given in step 128 indicating that scanning is being prepared as shown in FIG. 6G.

With the main console 3 in use, after depressing the preparation switch, the preparation switch and scan switch are turned OFF, to indicate that a scan is being prepared.

When preparation is completed, a display "H" is given in step 130 requesting an instruction to start scanning as shown in FIG. 6H.

With the main console 3 in use, the scan switch flickers, to request the scanning start instruction.

When a stop switch on the screen of FIG. 6H is touched as in step 132, a display "I" is given in step 134 indicating the scan being stopped as shown in FIG. 6I and the flow then returns to step 118 (displaying the content of FIG. 6F).

Figure 6J:
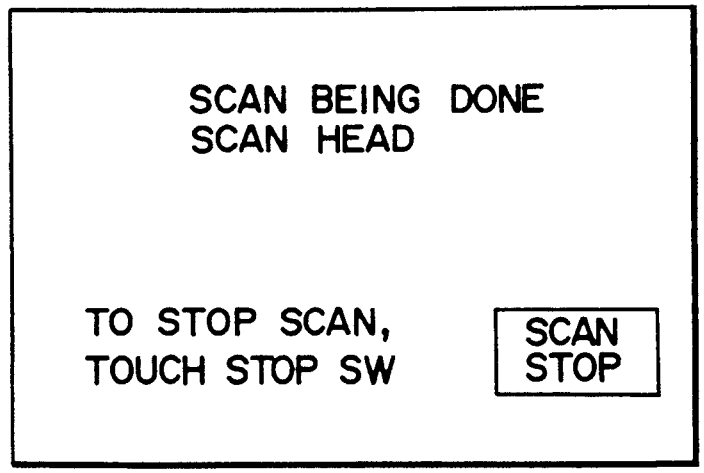
FIGS. 6A through 6Y are diagrams illustrating examples of a display of the simplified console.

When the scan switch on the screen of FIG. 6H is touched as in step 136, the scanning starts and a display "J" is given in step 138 indicating that a head is being scanned as shown in FIG. 6J. When the stop switch on the screen of FIG. 6J is touched as in step 132 even during scanning, the scanning is stopped and the flow returns to step 118 (displaying the content of FIG. 6F) through step 134 (displaying the content of FIG. 6I).

When the scanning ends, an image is reconstructed and a display "K" to that effect (see FIG. 6K) is given in step 140. When image reconstruction is completed, a display "M" to that effect (see FIG. 6M) is given in step 142. Thereafter, a sliced image is displayed on the monitor 5 in step 144.

Then, it is discriminated in step 146 whether or not the bed-local-switch is ON. If this switch is ON, the alarm message "E" as shown in FIG. 6E is displayed in step 148.

In step 150, a display "O" is given requesting for the next imaging preparation as shown in FIG. 6O.

With the main console 3 in use, the lamp on the set switch flickers to request the next preparation instruction. When a new patient comes, the patient registering button is depressed. To check a CT value, ROI should be specified.

When the return switch on the screen of FIG. 6O is touched as in step 124, the flow returns to step 108 (displaying the content of FIG. 6C). When the end switch on the screen of FIG. 6O is touched as in step 120, the flow returns to step 104 (displaying the content of FIG. 6B) through step 122.

When the preparation switch on the screen of FIG. 6O is touched as in step 152, the display "G" indicating that scanning is being prepared is given in step 154 and the display "H" is given in step 156 requesting an instruction to start the scanning (see FIG. 6H). When the stop switch on the screen of FIG. 6H is touched as in step 158, the display "I" indicating the scanning being stopped (see FIG. 6I) is given in step 160 and the flow returns to step 150 (displaying the content of FIG. 6O).

Figure 6K:
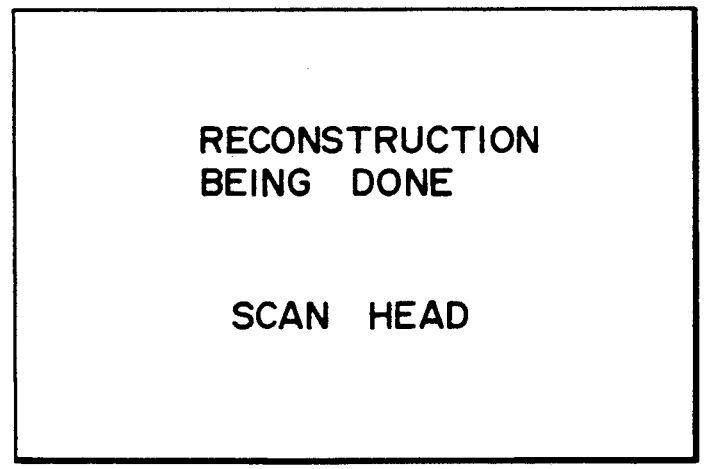
Figure 6M:
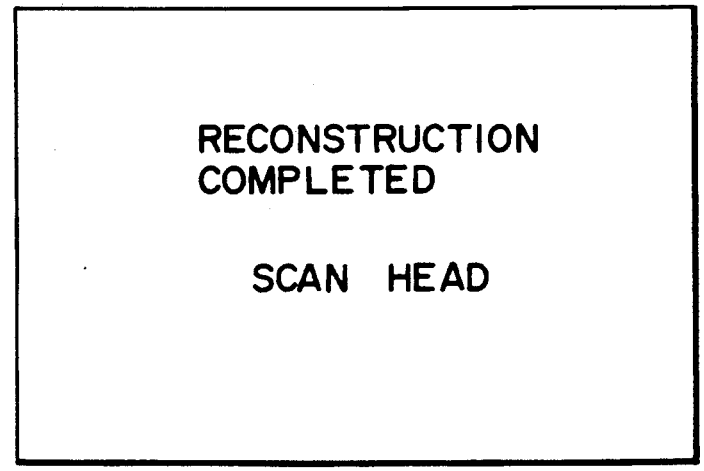

When the scan switch on the screen of FIG. 6H is touched as in step 162, the display "J" indicating that the scanning is in progress (see FIG. 6J) is given in step 164 and the flow returns to step 140 (displaying the content of FIG. 6K).

When a new patient switch on the screen of FIG. 6O is touched as in step 166 after execution of step 150 (FIG. 5D), the patient number is automatically incremented by "1" to automatically generate the next patient number and the flow returns to step 108 (displaying the content of FIG. 6C).

Figure 6X:
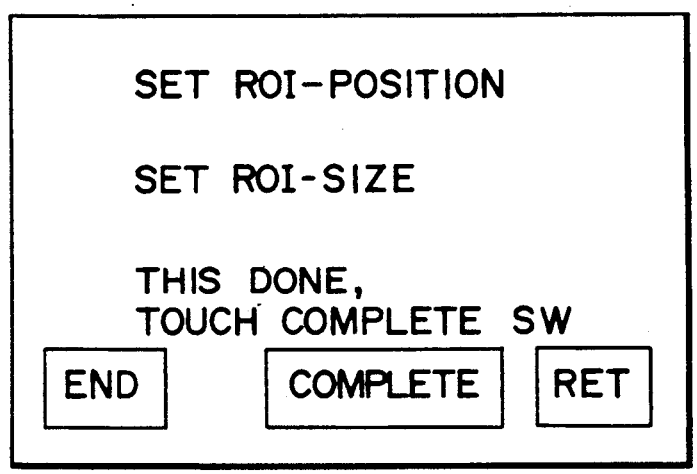
Figure 6Y:
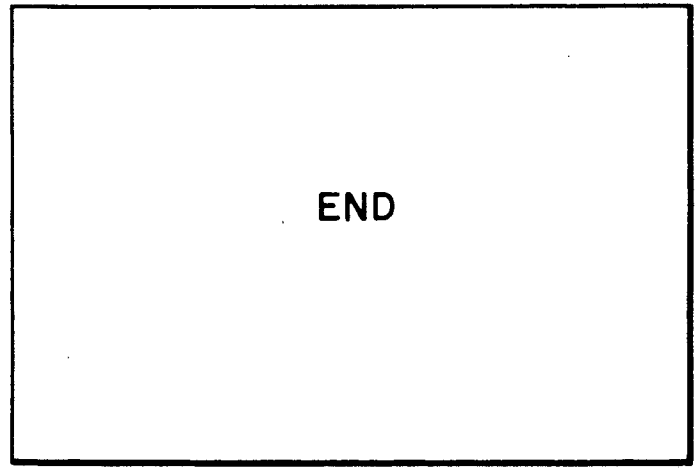

When a CT value switch on the screen of FIG. 6O is touched as in step 168, a display "X" is given in step 170 requesting that ROI be specified as shown in FIG. 6X. When the end switch on the screen of FIG. 6X is touched at this time as in step 120, the flow returns to step 104 (displaying the content of FIG. 6B) through step 122. When the return switch on the screen of FIG. 6X is touched as in step 172, the flow returns to step 150 (displaying the content of FIG. 6O).

When a track ball is operated to specify ROI in step 174 and the complete switch on the screen of FIG. 6X is touched as in step 176, the CT value of ROI is displayed on the monitor 5 in step 178. The flow then returns to step 170 (displaying the content of FIG. 6X).

Returning to the description of FIG. 5A, when the scano abdomen switch on the screen of FIG. 6C is touched as in step 180 after the content of FIG. 6C is displayed in step 108, a display "Q" is given in step 182 requesting that the scano direction be specified as shown in FIG. 6Q. Here, when the end switch on the screen of FIG. 6Q is touched as in step 120, the flow returns to step 104 (displaying the content of FIG. 6B) through step 122. When the return switch on the screen of FIG. 6Q is touched as in step 124, the flow returns to step 108 (displaying the content of FIG. 6C).

When a top or side switch on the screen of FIG. 6Q is touched as in step 184, a display "R" is given in step 186 indicating that scano is being prepared as shown in FIG. 6R.

It is discriminated in step 188 whether or not the bed-local-switch is ON. If the switch is ON, the alarm message "E" as shown in FIG. 6E is displayed in step 190.

In step 192, a display "S" is given requesting for preparation as shown in FIG. 6S. When the end switch on the screen of FIG. 6S is touched as in step 120, the flow returns to step 104 (displaying the content of FIG. 6B) through step 122. When the return switch on the screen of FIG. 6S is touched as in step 194, the flow returns to step 182 (displaying the content of FIG. 6Q).

When the preparation switch on the screen of FIG. 6S is touched as in step 196, the display "G" is given in step 198 indicating that the scanning is being prepared as shown in FIG. 6G, and a display "T" is given in step 200 indicating that a scanogram of an abdomen is to be scanned (see FIG. 6T). When the stop switch on the screen of FIG. 6T is touched as in step 202, the display "I" (see FIG. 6I) is given in step 204 and the flow returns to step 186 (displaying the content of FIG. 6R).

When the scan switch on the screen of FIG. 6T is touched as in step 206, a display "U" is given in step 208 indicating that a scanogram of an abdomen is being scanned as shown in FIG. 6U. The top plate of the bed is moved by a predetermined distance and a scanogram for the distance is obtained. When the stop switch on the screen of FIG. 6U is touched as in step 202, the flow returns to step 186 (displaying the content of FIG. 6R)

through step 204. In step 210, the display "L" is also given indicating that the reconstruction is being done as shown in FIG. 6L. In step 212, the display "N" indicating the end of the image reconstruction (see FIG. 6N) is given and the scanogram of the abdomen is displayed on the monitor 5 in step 214. A display "V" as shown in FIG. 6V is given in step 216.

When the end switch on the screen of FIG. 6V is touched as in step 120 following step 216, the flow returns to step 104 (displaying the content of FIG. 6B) through step 122. When the return switch on the screen of FIG. 6V is touched as in step 218, the flow returns to step 186 (displaying the content of FIG. 6R).

When the track ball is operated in step 220 following step 216 and the complete switch on the screen of FIG. 6V is touched as in step 222, a display "W" is given in step 224 indicating that the top plate is in motion as shown in FIG. 6W. The flow then returns to step 146.

With the main console in use, the scano button, a selection button for designating a scan direction, a preparation button, and a scano button are depressed to obtain a scanogram. The autoslide is selected from several menus in the scanogram and the displayed line is moved to the first scan position using the track ball. Then, an execution button is depressed.

Returning now to the description of FIG. 5A, when the CT value switch on the screen of FIG. 6C is touched as in step 226 following step 108, a display "X" is given in step 228 requesting the designation of ROI as shown in FIG. 6X. When the end SW on the screen of FIG. 6X is touched as in step 120, the flow returns to step 104 (displaying the content of FIG. 6B) through step 122 (displaying the content of FIG. 6Y). When the return switch on the screen of FIG. 6X is touched as in step 124, the flow returns to step 108 (displaying the content of FIG. 6C).

When the track ball is operated in step 230 and the complete switch on the screen of FIG. 6X is touched as in step 232, the CT value of ROI is displayed on the monitor 5 in step 234. Then, the flow returns to step 228 (displaying the content of FIG. 6X).

As described above, according to this embodiment, the use of the simplified console 4 is made possible instead of the main console 3 by turning the power switch 4c ON and touching the start switch on the touch panel 4b. Since the number of sequences to be selected and the number of parameters to be set are reduced, the use of the simplified console 4 permits a novice operator to easily operate the CT apparatus.

The simplified console 4 is not provided with ordinary switches but it is provided with touch switches, so that the operator needs to view only the screen and can therefore concentrate on the operation. The screen changes its display with the proceeding of a selected sequence. However, if an erroneous operation is selected, the display can be returned to the previous one to relieve the operator of possible nervousness he might feel along the operational sequence.

It should be noted that this invention is in no way restricted to the above particular embodiment, but can be modified in various manners without departing from the scope of the invention. For instance, like the main console 3, the simplified console 4 may be constituted by a keyboard which has a fewer number of keys than that of the main console 3. The switching between the main console 3 and simplified console 4 may be executed through the main console 3 or by a selector separately provided where the operator can easily operate it, such as an entrance of the test room. The disk memory device 6 may have different control modes for the main console 3 and simplified console 4. For instance, with the simplified console 4 in use, when the memory device 6 becomes full, images may be erased in order from the oldest one so that an insufficient memory capacity can be properly dealt with without requiring a troublesome operation. In addition, it is possible to provide several control modes, not just one, for the simplified console 4 so that the optimal mode can be selected in accordance with the skill of the operator or the type of a diagnosis. The simplified console 4 may be designed in such a way that it changes a guidance display requesting the next operation in accordance with the proceeding of the operational steps or it request the next operation using a sound, light, etc. The medical equipment to which this invention is directed is not restricted to an X-ray CT apparatus but may be an MRI apparatus or a radiation diagnosis apparatus.

What is claimed is:

1. A console assembly for a medical imaging apparatus which detects information about an object using a plurality of selected imaging parameters corresponding to a plurality of operational commands, said plurality of selected imaging parameters including at least a first set of imaging parameters corresponding to a first set of the operational commands and a second set of imaging parameters corresponding to a second set of the operational commands, and produces an image based on the detected information, said console assembly comprising:

first console means for inputting the entire plurality of selected imaging parameters and supplying a first output based on the entire plurality of selected imaging parameters;

second console means for inputting only the first set of imaging parameters, for disabling input of the second set of imaging parameters, and for supplying a second output based on the first set of parameters;

means for selecting between said first and second console means, said first console means supplying the first output to the medical imaging apparatus when said first console means is selected, and said second console means supplying the second output to the medical imaging apparatus when said second console means is selected; and storage means for storing the second set of imaging parameters and for automatically supplying a third output based on the second set of imaging parameters to the medical imaging apparatus at times when said second console means is selected.

2. The console assembly according to claim 1, wherein said first console means has key switches and buttons, and said second console means has a display section and touch switches formed in front of a screen of said display section.

3. The console assembly according to claim 2, wherein said display section of said second console means displays an operational guidance message in each step of an operational sequence and touch switches serving to give choices in said sequence, and changes a display to indicate a next step upon touching of said touch switches.

4. The console assembly according to claim 3, wherein said display section of said second console means displays a choice touch switch for returning a present display to a previous display.

5. The console assembly according to claim 1, wherein said selecting means selects said second console means instead of said first console means by an instruction from said second console means.

6. The console assembly according to claim 1, wherein said selecting means selects said first console means during a first desired time period, and said second console means during a second desired time period.

7. The console assembly according to claim 1, wherein said second console means includes means for inputting parameters relating to positioning the object and a start/stop operation of the medical imaging apparatus.

8. The console assembly according to claim 1, wherein said preset data stored in said memory means is supplied to the medical imaging apparatus when the selecting means selects said second console means.

9. A console assembly for an X-ray CT apparatus, comprising:
   first console means for inputting a first set of parameters corresponding to a plurality of operational commands for the X-ray CT apparatus including patient positioning, patient registration, scanogram scanning for a CT image, image display, image processing, image edition, image transfer, and image reconstruction;
   second console means for inputting a second set of parameters corresponding to a portion of said plurality of operational commands for the X-ray CT apparatus including patient positioning, scanogram scanning, and scanning for a CT image, and for disabling a remaining portion of said plurality of operational commands including patient registration, image display, image processing, image edition, image transfer, and image reconstruction, said second set of parameters being fewer in number than said first set of parameters;
   means for selecting between said first and second console means, wherein only the selected console means provides operational commands to the X-ray CT apparatus; and
   storage means for storing the parameters corresponding to said remaining portion of operational commands and for supplying said remaining portion of operational commands to the X-ray CT apparatus at times when said second console means is selected.

10. The console assembly according to claim 9, wherein said first console means has key switches and buttons, and said second console means has a display section and touch switches formed in front of a screen of said display section.

11. The console assembly according to claim 10, wherein said display section of said second console means displays an operational guidance message in each step of an operational guidance sequence and touch switches serving to give choices in said sequence, and changes a display to indicate a next step upon touching of said touch switches.

12. The console assembly according to claim 11, wherein said display section of said second console means displays a choice touch switch for returning a present display to a previous display.

13. The console assembly according to claim 11, wherein said second console means displays a choice touch switch for reversing said operational guidance sequence.

14. The console assembly according to claim 9, wherein said selecting means selects said second console means instead of said first console means by an instruction from said second console means.

15. The console assembly according to claim 9, wherein said selecting means selects said first console means during a first desired time period, and selects said second console means during a second desired time period.

* * * * *